(12) United States Patent
Lee et al.

(10) Patent No.: US 7,439,200 B2
(45) Date of Patent: Oct. 21, 2008

(54) FLUOROPOLYMER-GLASS FABRIC FOR CIRCUIT SUBSTRATES

(75) Inventors: Jeong Chang Lee, Shizuoka (JP); Etsuya Taki, Yokohama (JP)

(73) Assignee: DuPont-Mitsui Fluorochemicals Co. Ltd., Tokyo (JP)

( * ) Notice: Subject to any disclaimer, the term of this patent is extended or adjusted under 35 U.S.C. 154(b) by 28 days.

(21) Appl. No.: 11/505,729

(22) Filed: Aug. 17, 2006

(65) Prior Publication Data
US 2007/0049146 A1    Mar. 1, 2007

(30) Foreign Application Priority Data
Aug. 24, 2005    (JP)    ............... 2005-242041

(51) Int. Cl.
*B32B 15/14*    (2006.01)
(52) U.S. Cl. ............... 442/232; 442/316; 442/378; 428/421
(58) Field of Classification Search .......... 428/421, 428/422; 442/180, 209, 59, 110, 232, 316, 442/378
See application file for complete search history.

(56) References Cited

U.S. PATENT DOCUMENTS

| | | |
|---|---|---|
| 3,934,064 A | 1/1976 | Lowthian |
| 4,886,699 A | 12/1989 | Carroll et al. |
| 6,500,529 B1 | 12/2002 | McCarthy et al. |
| 7,261,937 B2 * | 8/2007 | Lee et al. ............... 428/300.7 |
| 2003/0082974 A1 * | 5/2003 | Samuels et al. ............. 442/327 |
| 2003/0118836 A1 | 6/2003 | Lee et al. |
| 2004/0132372 A1 * | 7/2004 | Samuels et al. ............. 442/327 |
| 2005/0136233 A1 * | 6/2005 | Samuels et al. ............. 428/212 |

FOREIGN PATENT DOCUMENTS

| | | |
|---|---|---|
| GB | 1 392 569 | 4/1975 |
| GB | 2 187 467 A | 9/1987 |
| JP | 62-261190 | 11/1987 |
| JP | 01005835 | 1/1989 |
| JP | HEI 2-261830 | 10/1990 |
| JP | 06344500 | 12/1994 |
| JP | 1996276547 A | 10/1996 |
| JP | 3139515 B2 | 3/2001 |

* cited by examiner

*Primary Examiner*—N Edwards

(57) ABSTRACT

An improved circuit substrate is provided wherein glass cloth is completely embedded within fluoropolymer by thermocompression to form a composite structure, which when containing an adhesive agent such as the combination of functional groups and liquid crystal polymer is self-adhering to a metal layer such as of copper.

11 Claims, 1 Drawing Sheet

FLUOROPOLYMER-GLASS FABRIC FOR CIRCUIT SUBSTRATES

FIELD OF THE INVENTION

This invention relates to circuit substrates for supporting and dimensionally stabilizing printed circuits, while providing good electrical insulation between circuits, and in particular to the use of fluoropolymer and glass fabric to provide such substrate.

BACKGROUND OF THE INVENTION

In the field of electrical and electronic parts, along with development of miniaturized devices with high performance and high density, it is desired to develop circuit substrate materials with excellent heat resistance, dimensional stability, low hygroscopicity, adhesion to copper foil, and good high frequency characteristics.

Fluoropolymers can be used in circuit substrates since they have low dielectric constants. Although many fluoropolymer-based materials for high frequency circuit substrates have been proposed (U.S. Pat. No. 3,139,515, Japanese Kokai Patent Application No. Hei 8[1996]-276547, Sho 62[1987]-261190) to meet the demands of the high-frequency applications, they all have shortcomings.

As a base material for high-frequency circuit substrates using glass cloth, the glass cloth is coated with an aqueous dispersion of fluoropolymer, which enables the fluoropolymer to impregnate the glass cloth, followed by drying and baking the impregnated glass cloth. The impregnated glass cloth is disclosed in Japanese Kokai Patent Application No. Hei 2[1990]-261830) and U.S. Pat. No. 4,886,699. In both patent publications, the preferred fluoropolymer is polytetrafluoroethylene (PTFE). However, in order to obtain such base material with sufficient adhesion between the non-melt-flowable PTFE and glass cloth, it is necessary to perform press molding at high temperature under high pressure. Even then, gaps are left at the interface between the PTFE and glass cloth, resulting in etching solution used to form the printed circuit and/or the moisture in the air entering such gaps easily to increase the water absorption rate. The result of this moisture absorption is that the dielectric constant and dielectric loss tangent of the circuit substrate becomes uneven, rendering the printed circuit defective. The Kokai publication adds to the PTFE impregnated glass cloth impregnation by aqueous dispersion of tetrafluoroethylene/perfluoro(alkyl vinyl ether), commonly known as PFA-impregnated glass cloth and then uses an additional PFA-impregnated glass cloth layer as an adhesive layer to bond the PTFE/PFA impregnated glass cloth to metal foil. The combination of base layer and adhesive layer to form the circuit substrate increases the cost of the circuit substrate. The circuit substrate of U.S. Pat. No. 4,886,699 is similarly complicated, i.e. additional layering between the PTFE impregnated glass cloth and the copper circuit-forming layer is provided. In FIG. 1, two microglass fiber reinforced fluoropolymer layers 14 and 16 surround the PTFE impregnated layer and in turn, two conductive layers 20 and 22 are provided on the exposed surfaces of layers 14 and 16. FIG. 2 includes additional upper and lower bonding layers to improve the adhesion between the fluoropolymer layers 14' and 16' and the metal cladding forming the conductive layers.

Japanese Kokai Patent Application No. 2003-200534 and its equivalent U.S. Patent Application Publication No. 2003/0118836 discloses a different approach to the formation of a circuit substrate. According to this approach, a fluoropolymer sheet is formed, which contains both functional groups and liquid crystal polymer (LCP) oriented in the fibrous state, the functional groups acting as a compatibilizer to enable the LCP to be dispersed as small particles, preferably no greater than 30 micrometers in diameter, during melt mixing of the fluoropolymer and the LCP. The combination of the LCP oriented in the fibrous state and the functional groups enable the fluoropolymer sheet to adhere to copper foil without the use of an adhesive. This fluoropolymer sheet is used in a number of constructions to form a circuit substrate. In one embodiment, two of the sheets are overlapped with the oriented fibrous LCP running in different directions, preferably at right angles to provide isotropy. In another embodiment, the functional group containing fluoropolymer is in the form of fibers, the LCP is oriented in the fibrous state within the fiber. This fiber is knit or woven into a fabric and a fluoropolymer sheet containing no LCP is laminated to one or both sides of the fabric. A fluoropolymer sheet containing the functional groups and LCP oriented in the fibrous state is needed to adhere the fabric/fluoropolymer sheet assemblage to the conductive layer. Another embodiment involves laminating the fluoropolymer sheet containing both functional groups and LCP oriented in the fibrous state to a polymer sheet, such as a polyimide sheet, that has a low coefficient of thermal expansion, i.e. no greater than $6\times10^{-5}/°$ C., which serves to limit the thermal expansion of the fluoropolymer and provides isotropy to the laminate, notwithstanding the orientation of the fibrous LCP.

There remains a need for a dielectric circuit substrate that can take advantage of the excellent electrical insulating properties, chemical inertness and high temperature resistance of fluoropolymers, while achieving dimensional stability and reduced coefficient of expansion and low hygroscopicity, and while also achieving adhesion to metal conductor, usually of copper. There also remains the need to accomplish these goals with a simplified, and therefore economical circuit substrate construction.

SUMMARY OF THE INVENTION

The present invention satisfies this need by providing a composite structure comprising glass cloth and melt-processable fluoropolymer, the entire thickness of the glass cloth being embedded in the fluoropolymer, said fluoropolymer containing an effective amount of adhesive agent to improve the adhesion of the composite structure to a copper layer by at least 60% as compared to said composite structure wherein said embedded fluoropolymer contains no adhesive agent.

One advantage of this composite structure is that it is self-adhering to an electrically conductive metal layer, which will typically be copper. No intervening adhesive layer is needed and no surface treatment of either the metal layer or the composite structure is needed to obtain this adhesion between the composite structure and the electrically conductive metal layer. Another advantage of the composite structure is its excellent properties, making it particularly useful as a circuit substrate. The circuit substrate formed by this composite structure has excellent heat resistance, low hygroscopicity, low dielectric constant and low dissipation factor (tan delta), making the circuit substrate suitable for high frequency electric application, and high mechanical strength, low linear expansion coefficient and low thermal shrinkage rate as well as improved dimensional stability. The combination of the fluoropolymer and the glass cloth into a single sheet provides this excellent combination of properties. The composite structure will typically be in the form of a sheet having two opposing planar surfaces, top and bottom surfaces, that can be made to the desired circuit-use size or to a larger size that can be trimmed or cut to the desired size. The composite structure of the present invention preferably has a dielectric constant at a frequency of 10 GHz of no greater than 3.0 and a coefficient of linear expansion of no greater than $25 \times 10^{-6}/°C$.

In another embodiment, the composite structure of the present invention has an electrically conductive metal layer, typically of copper, more typically copper foil, adhered to at least one surface and possibly both surfaces of the composite structure, this adhesion being as described above. Thus, the composite structure of the present invention forms a simplified dielectric circuit substrate, i.e. the composite structure is a single layer or sheet of material, and the conductive layer adheres directly to it, without the need for an intervening adhesive of bonding layer.

In another embodiment, the adhesive agent is the combination of the fluoropolymer having functional groups (functionalized fluoropolymer) and containing liquid crystal polymer (LCP). This adhesion, enabled by the presence of both the functional groups and the LCP in the fluoropolymer, preferably provides a peel strength with respect to the conductive layer when it is copper of at least 0.8 kg/cm. Preferably, the electrically conductive layer is adhered to both surfaces of the composite structure, and the adhesion at both surfaces is at least 0.8 kg/cm.

According to another embodiment of the present invention, a composite structure can be made by the process comprising contacting a surface of a melt-processable fluoropolymer sheet with a surface of glass cloth, and compressing the glass cloth into the molten fluoropolymer sheet, thereby forming a composite structure wherein the entire thickness of the glass cloth is embedded into the fluoropolymer sheet. The combination of melting and compressing involves the pressing together of fluoropolymer sheet(s) and glass cloth(s) and is sometimes referred to herein as thermocompressing or thermocompression. Preferably, the fluoropolymer sheet contains adhesive agent, and such sheet exhibits the same adhesive improvement and peel strength as described above, and preferably, the adhesive agent is the same functional group/LCP combination described above. This process can also be used to embed the glass cloth in the adhesive agent-containing fluoropolymer described above to force the entire thickness of the glass cloth into the fluoropolymer sheet. The melting/compression process can be carried out simultaneously with the lamination of an electrically conductive metal layer, preferably of copper, to the composite structure as it is being formed, or the lamination can be carried out after the composite structure is formed. The electrically conductive metal layer can thus be laminated to one or both surfaces of the composite structure.

The melting/compression process starts out with an overlapping (stacking) of the fluoropolymer sheet and the glass cloth, and after melting and compression, a single sheet of composite structure is obtained. Although the process can be considered a lamination process, the result of the melting and compression is a unitary (single) layer product. The glass cloth is present as a dimensionally stable core within the composite structure but extending essentially throughout the thickness of the sheet of composite structure. The melt-processable fluoropolymer sheet can be formed by melt extruding the melt-processable fluoropolymer onto a surface of the glass cloth or can be formed independently, i.e. as a sheet prior to being brought into contact with the surface of the glass cloth.

Surprisingly, not only does the molten fluoropolymer fill all open spaces within the glass fabric as a result of the melting and compression steps described above, the fluoropolymer is also present at both surfaces of the glass cloth so that when it contains adhesive agent, the composite structure is self-adhering at both surfaces. It is surprising that this thermocompression can achieve such total penetration and filling of the glass cloth with the fluoropolymer, because of the notoriously high melt viscosity of fluoropolymer. The melt flowability of fluoropolymers is typically characterized by the rate in g/10 min at which molten fluoropolymer flows through a small orifice (2.09 mm in diameter) under the force of a 5 kg weight in accordance with ASTM 1238-95. This is called the melt flow rate (MFR). While an MFR of 50 g/10 min denotes twice the flowability of an MFR of 25 g/10 min, in actuality, the fluoropolymer having the MFR of 40 g/10 min is still high viscosity polymer.

According to another embodiment for making the composite structure of the present invention, the composite structure contains two glass cloths superimposed adjacent to one another, and both glass cloths have fluoropolymer containing the adhesive agent embedded in and through the thickness of the glass cloths. One embodiment for making this composite structure comprises interposing a sheet of said fluoropolymer containing the adhesive agent between two glass cloths and melting said sheet while compressing it against said glass cloths, thereby forcing said sheet into and through the thickness of both said glass cloths to fill said glass cloths with said fluoropolymer. In this embodiment, the fluoropolymer fills the open spaces in the glass cloths by the glass cloths becoming embedded in the molten fluoropolymer sheet. Such fluoropolymer reaches the outer surfaces of the two-glass cloth fluoropolymer-filled composite. Surprisingly, the resultant composite structure as exemplified in Example 2 exhibits a peel strength (to a copper layer) that is 80% greater than when no adhesive agent is present in the fluoropolymer.

In another embodiment, the composite structure is made by each surface of a glass cloth being contacted by a sheet of said fluoropolymer, preferably containing the containing the adhesive agent, i.e. the glass cloth is sandwiched between two sheets of fluoropolymer, and the melting and compressing applied to this assemblage embeds the glass cloth in the sheets of fluoropolymer. In this embodiment, the two sheets of fluoropolymer are compressed into a single sheet, within which the glass cloth is embedded through the entire thickness of the glass cloth.

DETAILED DESCRIPTION OF THE INVENTION

Figure 1:
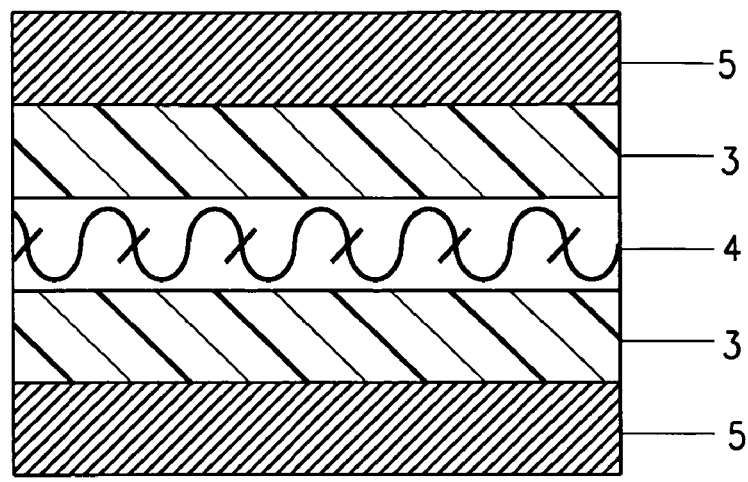
FIG. 1 is a schematic cross-sectional view of the arrangement of a layer of glass cloth sandwiched between two sheets of fluoropolymer, which are, in turn, sandwiched between two layers of electrically conductive material prior to thermocompressing this loose assemblage of layers together, according to one embodiment of the present invention.

To first describe the materials used in the practice of the present invention, examples of the glass cloth that can be used in the present invention include glass cloth made of E glass (alkali-free glass for electric use), S glass (high strength glass), D glass (glass with better dielectrical properties than E glass), quartz glass, silica glass (low dielectric glass), C glass (alkali-containing glass for chemical use), etc.

The single filament diameter of the glass fibers that constitute the glass cloth used in the present invention is preferred to be in the range of 2-15 μm. If the fibers are too thin, they will be bend easily, making the fabric limp, and difficult to handle. On the other hand, if the fibers are too thick, the surface smoothness of the laminate obtained will be adversely affected. Although the thickness of the glass cloth depends on the strength required for the printed board or film material to be formed, the thickness of the melt-processable fluoropolymer sheet used, and the conditions of thermocompression, it is preferred that the glass cloth thickness be in the range of 5-250 μm. If the glass cloth is too thin, the strength of the glass cloth becomes low, making it difficult to handle in the molding operation. On the other hand, excessive thickness requires the use thick glass fibers in order to achieve the thickness. As a result, the surface smoothness of the obtained composite structure becomes poor, and it is difficult to embed the glass cloth into the melted fluoropolymer.

The glass cloth or the glass fibers or filaments (yarn) making up the glass cloth may have a coating to improved adhesion, such as a coating of silane coupling agent.

The construction of the glass cloth should be dimensionally stable so as to impart dimensional stability to the fluoropolymer within which the glass cloth will be embedded. Any construction can be used that provides this dimensional stability. The simplest of such construction is the woven construction, and examples of woven constructions include plain, twill, satin fabric, and triaxial woven constructions. Alternatively a spun-bonded cloth construction can be used.

The melt-processable fluoropolymers used for general molding can be used in the present invention. However, it is preferred to use a melt-processable fluoropolymer containing an adhesive agent, or a mixture of melt-processable fluoropolymer containing an adhesive agent with a melt-processable fluoropolymer used for general molding that does not contain adhesive agent.

Examples of the melt-processable fluoropolymers used for general molding include polymers or copolymers of fluoromonomers such as fluorinated olefins, fluorinated chlorinated olefins, copolymers of fluoromonomer with hydrocarbon olefins, fluoromonomers containing ether groups, or copolymers of these fluoromonomers with fluorinated olefins or ethylene. Specific examples include polymers or copolymers of monomers selected from tetrafluoroethylene, chlorotrifluoroethylene, hexafluoropropylene, perfluoro(alkyl vinyl ether) (PAVE, which includes perfluoro(propyl vinyl ether) (PPVE), perfluoro(ethyl vinyl ether) (PEVE), perfluoro(methyl vinyl ether) (PMVE), vinylidene fluoride, and vinyl fluoride, or copolymers of these monomers and ethylene.

More specifically, examples that can be used include polymers such as tetrafluoroethylene/perfluoro(alkyl vinyl ether) copolymer (referred to as PFA hereinafter and including the polymer called PMA by its manufacturer, it being a polymer of TFE with PMVE and PPVE), tetrafluoroethylene/hexafluoropropylene copolymer (FEP), tetrafluoroethylene/hexafluoropropylene/perfluoro(alkyl vinyl ether) copolymer (EPE), tetrafluoroethylene/ethylene copolymer (ETFE), polyvinylidene fluoride (PVDF), polychlorotrifluoroethylene (PCTFE), and chlorotrifluoroethylene/ethylene copolymer (ECTFE). Preferably, the melt-processable fluoropolymer has an MFR of at least 25 g/10 min as determined in accordance with ASTM D1238-95 at a melt temperature that is standard for the particular fluoropolymer, e.g. 372° C. for PFA and FEP.

The melt-processable fluoropolymer does not include polytetrafluoroethylene (PTFE) because this polymer has such a high molecular weight, and resulting high melt viscosity, that it does not flow in the molten condition. Polytetrafluoroethylene micropowder is melt-processable, by virtue of a low enough molecular weight obtained either by direct polymerization or by exposing PTFE to degradative radiation. Polytetrafluoroethylene micropowder is not useful in the present invention because of its low strength resulting from its low molecular weight relative to PTFE. One manifestation of this low strength is brittleness; it has virtually no elongation. In contrast, the melt-processable fluoropolymers used in the present invention have high strength, including an elongation at break of least 200%, preferably at least 250%, as determined by the procedure of ASTM D638-03 on dumbbell-shaped specimens 15 mm wide and 38 mm long and having a web width of 5 mm, stamped from a 1.5 mm thick compression molded plaque.

The thermocompression process practiced on a sheet of the melt-processable fluoropolymer and glass cloth is useful for obtaining a single sheet of fluoropolymer with the glass cloth completely embedded therein. Such composite structure can be used together with an adhesive layer to adhere the composite structure to another article such as conductive metal layer. Preferably, however, the fluoropolymer contains an adhesive agent that is, under thermocompression, self-adhering to the conductive metal layer. The preferred adhesive agent is the combination of the fluoropolymer containing functional groups and liquid crystal polymer (LCP).

Examples of melt-processable fluoropolymers having functional groups include melt-processable fluoropolymers containing functional groups selected from carboxylic acid groups or their derivative groups, hydroxyl groups, nitrile groups, cyanato groups, carbamoyloxy groups, phosphonoxy groups, halophosphonoxy groups, sulfonic acid groups or their derivative groups. The functional group containing fluoropolymer serves as a compatibilizing agent for the LCP while providing some adhesion improvement to the fluoropolymer. The functional group containing fluoropolymer is normally used within a range that will not significantly affect the properties of the said melt-processable fluoropolymer for general molding. For example, it is possible to polymerize to make one of the said melt-processable fluoropolymers used for general molding, followed by adding or substituting the functional groups, such as by a grafting process. It is also possible to copolymerize a monomer having the said functional groups while polymerizing the said melt-processable fluoropolymer.

Specific examples of functional groups include —COOH, —CH$_2$COOH, —COOCH$_3$, —CONH$_2$, —OH, —CH$_2$OH, —CN, —CH$_2$O(CO)NH$_2$, —CH$_2$OCN, —CH$_2$OP(O)(OH)$_2$, —CH$_2$OP(O)Cl$_2$, and —SO$_2$F. These functional groups are preferably introduced into the fluoropolymer by copolymerization.

Fluorine-containing monomers suitable for copolymerization and having such functional groups include, for example, fluorinated vinyl ether compounds represented by the formulas: $CF_2\text{=}CF[OCF_2CF(CF_3)]_m\text{—}O\text{—}(CF_2)_n\text{—}X$, where m is 0-3; n is 0-4, X is —COOH, —CH$_2$COOH, —COOCH$_3$, —CH$_2$OH, —CN, —CH$_2$O(CO)NH$_2$, —CH$_2$OCN, —CH$_2$OP(O)OH)$_2$, —CH$_2$OP(O)Cl$_2$, and —SO$_2$F. Preferred are functional group-containing fluorinated vinyl ethers such as those represented by the formula $CF_2\text{=}CF\text{—}O\text{—}CF_2CF_2\text{—}SO_2F$, or $CF_2\text{=}CF[OCF_2CF(CF_3)]O$ $(CF_2)_2$—Y, where Y represents —$SO_2F$, —CN, —COOH, or —$COOCH_3$, or those represented by the formula $CF_2$=CF[$OCF_2CF(CF_3)$]O$(CF_2)_2$—$CH_2$-Z, where Z represents —COOH, —OH, —OCN, —OP(O)(OH)$_2$, —OP(O)Cl$_2$, and —O(CO)NH$_2$.

It is preferred to copolymerize the monomer containing the functional groups in an amount of, for example, 0.5-10 wt %, more preferably, in the range of 1-5 wt % in the functional group containing fluoropolymer, based on the total weight of the functionalized fluoropolymer. The functional group containing monomer can be distributed either uniformly or non-uniformly in the functional group containing fluoropolymer. If the content of the functional group containing monomer in the functional group containing fluoropolymer is too low, the compatibilizing effect becomes inadequate. On the other hand, if the content is too high, a reaction similar to a crosslinking reaction may occur under the strong interaction in the functional group containing fluoropolymer. As a result, the viscosity will rise significantly, making melt compression difficult. Also, if the content of the functional group containing monomer is too high, the heat resistance (thermal stability) of the fluoropolymer will deteriorate.

Although there is no special limitation on the viscosity or molecular weight of the functional group containing fluoropolymer, it is preferred not to exceed the viscosity or molecular weight of the melt-processable fluoropolymer for general molding, into which the functional group containing fluoropolymer is added. It is preferred to be at the same level, e.g. the viscosity is within 80%, preferably within 50%, and more preferably within 30% of the general molding (free of functional groups) fluoropolymer. This is preferably determined by comparing melt flow rates.

The liquid crystal polymer used in the present invention is a thermoplastic resin that forms thermotropic liquid crystal. There is no special limitation on the melting point of the liquid crystal polymer as long as there is no problem in the heat resistance (thermal stability) at the melt compression temperature. However, from the point of view of moldability and thermal stability, it is preferred to use a liquid crystal polymer with a melting point higher than that of the melt-processable fluoropolymer for molding by at least 15° C.

Examples of the said liquid crystal polymer include polyester, polyester amide, polyester imide, polyester urethane, among which polyester is particularly preferred. A typical example of the liquid crystal polyester is total aromatic polyester. There are many examples, such as compounds derived from aromatic dicarboxylic acids and aromatic dihydroxy compounds and/or aromatic hydroxydicarboxylic acids, and compounds obtained by partially substituting the said total aromatic polyesters with the polymerization units derived from aliphatic dicarboxylic acids, aliphatic dihydroxy compounds, aliphatic hydroxydicarboxylic acids, etc. Specific examples include the compounds with polymerization units derived from terephthalic acid, isophthalic acid, 2,6-naphthalene dicarboxylic acid, or other aromatic dicarboxylic acids, hydroxyquinone, resorcin, 2,6-dihydroxynaphthalene, bisphenol A, dihydroxydiphenyl, or other aromatic dihydroxy compounds, parahydroxybenzoic acid or other aromatic hydroxycarboxylic acids.

In the present invention, as one method for manufacturing a fluoropolymer sheet having a liquid crystal polymer dispersed in melt-processable fluoropolymer, preferably, a fluoropolymer sheet with liquid crystal polymer oriented in a fibrous form in the melt-processable fluoropolymer, the melt-processable fluoropolymer and the liquid crystal polymer, preferably also including the functional group containing fluoropolymer, is melted blended as well, followed by extrusion molding performed under appropriate conditions to mold the obtained mixture into a sheet shape. Rather than the entire melt-processable fluoropolymer being functionalized, it is preferred that the melt-processable fluoropolymer be a blend of melt-processable fluoropolymer that has no functional groups with melt-processable fluoropolymer that does contain functional groups to obtain the concentration of functional groups desired. When forming the fluoropolymer sheet, the proportion of the functional group containing fluoropolymer (compatibilizing agent) added varies depending on the type of the functional groups and the content of the functional group containing fluoropolymer. The proportion of functionalized fluoropolymer is preferred to be in the range of 0.5-30 wt %, more preferably in the range of 1-15 wt % based on the combined weight of total fluoropolymer and LCP. As the proportion of the compatibilizing agent is increased, the interfacial tension between the fluoropolymer and the liquid crystal polymer is reduced, and the boundary adhesion force becomes strong. However, if the proportion is too high, a reaction similar to a crosslinking reaction might occur under the strong interaction in the compatibilizing agent. As a result, the viscosity of the raw material composition will increase significantly, making melt molding and melt compression difficult. Also, if the proportion of the functional group containing fluoropolymer is too high, the heat resistance of the fluoropolymer sheet may deteriorate.

It is preferred to adjust the content of the liquid crystal polymer in the said fluoropolymer sheet to 0.5-30 wt %, more preferably in the range of 3-25 wt %, based on the combined weight of total fluoropolymer and LCP. If the content of the liquid crystal polymer is too low, the high adhesion with an electrically conductive metal layer, notably copper foil, does not occur. If the content is too high, a large amount of liquid crystal polymer is present in continuous fibrous form in the fluoropolymer matrix. The local viscosity will drop significantly during the sheet extruding process, making it very difficult to obtain a sheet of uniform thickness. Preferably, the LCP in the fluoropolymer sheet increases the MFR of the sheet composition by at least 10%, preferably at least 20% as determined at the standard temperature for the particular fluoropolymer by itself present in the sheet. More preferably, the MFR of the sheet composition is at least 35 g/10 min, more preferably at least 45 g/10 min.

The combination of functional groups and liquid crystal polymer improves the adhesion strength with respect to copper foil or other metals.

When the liquid crystal polymer is blended with the melt-processable fluoropolymer, the melt viscosity of the mixture obtained is lower than that of the melt-processable fluoropolymer alone (melt flow rate becomes higher). This facilitates the embedding of the glass cloth into the fluoropolymer sheet by thermocompression. Consequently, a uniform fluoropolymer containing laminate with no gaps at the boundary (interface) between the glass cloth and its filaments and the melt-processable fluoropolymer can be obtained.

Although any normal melt blending method can be used to blend the melt-processable fluoropolymer, the functional group containing fluoropolymer, and the thermoplastic liquid crystal polymer as the raw materials of the fluoropolymer containing sheet used in the present invention, it is preferred to use an extruder to carry out the melt blending at a temperature above the melting temperature of both the fluoropolymer and the LCP. In this case, a high shearing speed is preferred since the size of the dispersed liquid crystal particles becomes smaller. It is also preferred to use a biaxial (twin screw) extruder over a monoaxial (single screw) extruder. Also, in the sheet extruding operation it is preferred to use a T die or ring-shaped die after melt blending, in order to form liquid crystal polymer domains (particles) with uniform small size dispersed in the fluoropolymer matrix. The particle size of the dispersed liquid crystal polymer in the melt blended state before sheet extrusion is preferably no greater than 30 µm, preferably, in the range of 1-10 µm.

The dispersion of LCP in the melt-processable fluoropolymer, if extruded at a temperature above the melting temperature of both the fluoropolymer and the LCP, causes the dispersed domains of LCP to become oriented in the fibrous state in the extruded sheet. In order to obtain a melt-processable fluoropolymer sheet in which the thermoplastic liquid crystal polymer is oriented in a fibrous form, the molten mixture of the said melt-processable fluoropolymer for general molding, thermoplastic liquid crystal polymer, and preferably, the functional group containing fluoropolymer as well (referred to as fluoropolymer mixture hereinafter), is processed into a sheet form by means of extrusion molding using a T die or ring-shaped die. During the extrusion process, the dispersed particles of the liquid crystal polymer dispersed in the fluoropolymer matrix are converted into fibrous form oriented in the extrusion direction.

The diameter of the liquid crystal polymer present in fibrous form in the fluoropolymer matrix of the melt-processable fluoropolymer extruded sheet can be controlled by the particle size of the liquid crystal phase dispersed in the melted mixture before sheet extrusion, and by the draft (draw) ratio (die lip clearance/thickness of the film after drawing) during the melt extrusion process. As the size of the liquid crystal polymer domain (particles) in the melted mixture before sheet extrusion is reduced or as the drawing speed is increased, the diameter of the liquid crystal polymer in fibrous form is also reduced. The draft ratio is preferred to be 5 or higher, especially in the range of 10-50. The extrusion to form the fluoropolymer sheet can also be carried out at a temperature above the melting point of the fluoropolymer, but below the melting point of the LCP, whereby the LCP will be present in the fluoropolymer as dispersed particles of LCP having the particle size described above. The combination of the LCP in either the dispersed particle form or the oriented fibrous form, together with the presence of the functional groups provides the adhesion improvement described above.

The thickness of the fluoropolymer sheet, preferably containing the adhesive agent, such as the combination of the liquid crystal polymer, optionally present in fibrous form, and the functional groups, is preferably in the range of 3-500 µm, preferably, in the range of 5-100 µm, more preferably, in the range of 10-70 µm. The expression "sheet" as used herein includes film. If the melt-processable fluoropolymer sheet is too thin, it is not possible to obtain a composite structure in which the glass cloth is fully embedded into the melted melt-processable fluoropolymer sheet during thermocompression. The volume of the fluoropolymer sheet should be sufficient to completely embed the glass cloth, i.e. completely fill the open spaces in the fabric with the fluoropolymer composition and provide this composition at each surface of the glass cloth. This will depend on the thickness of the glass cloth and its basis weight (g/m$^2$). The thicker the glass filaments for a given glass cloth thickness, the less will be the volume of fluoropolymer needed.

The fluoropolymer containing composite structure of the present invention can be obtained by thermocompression as described above. The sheet should be molten during compression. Thus, the thermocompression temperature should be above the melting temperature of the fluoropolymer and above the flow temperature of the LCP. Some LCP exhibit melt flow at several degrees temperature less than the melt temperature of the LCP. When a fluoropolymer sheet containing liquid crystal polymer oriented in the fibrous form is used, this orientation is in the extrusion direction (MD direction). The result is significant anisotropic properties in the MD direction and TD direction of the sheet. However, the anisotropy of the anisotropic fluoropolymer sheet is overcome by the incorporation of the glass cloth into the sheet by the thermocompression process. Copper foil to be etched into a printed circuit can be integrated during thermocompression bonding to obtain a fluoropolymer containing copper-clad laminated circuit board. It is also possible to use the composite structure as sheet, film material, or lining material for large assemblies since it has excellent chemical resistance, heat resistance, water repellency, weatherability, low hygroscopicity, and adhesion strength to the base material.

Figure 2:
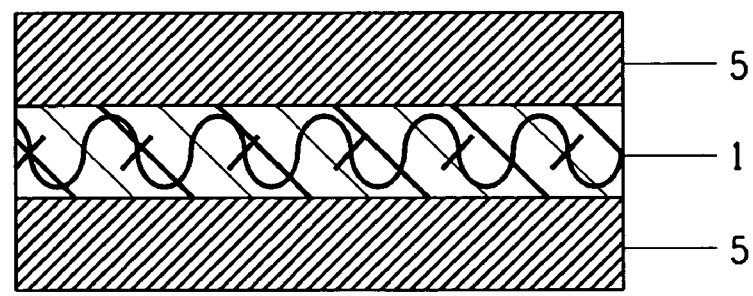
FIG. 2 is a schematic cross-sectional view of the embodiment of FIG. 1 after the application of melting and compression.

FIG. 1 shows the state before thermocompression. Glass cloth 4 is positioned (sandwiched) between and in contact with two melt-processable fluoropolymer sheets 3, one on each side of the glass cloth, and this assemblage is sandwiched between and in contact with two layers 5 of electrically conductive metal. FIG. 2 shows the state after thermocompression to form composite structure 1 using a vacuum hot plate press. As shown in FIG. 2, composite structure 1 is characterized by the glass cloth being completely embedded into the fluoropolymer sheets, and in this embedding process the molten fluoropolymer sheets are united within the thickness of the glass cloth, so that the two sheets are no longer distinguishable. The result of the thermocompression is as shown in FIG. 2, simply the two metal layers 5 adhered to the surface of the composite structure 1.

Figure 3:
FIG. 3 is a schematic cross-sectional view of the embodiment of FIG. 2 after removal of the layers of electrically conductive material, i.e. a cross-sectional view of one embodiment of the composite structure of the present invention.

In practice, the metal layer of the composite structure would be selectively etched to form a printed circuit on the composite structure 1 from the metal layer remaining after the etching. For test purposes, the metal layers in FIG. 2 are completely etched away as shown in FIG. 3 so that only the composite structure 1 remains for measurement of the dielectric constant and the linear expansion coefficient. In this composite structure, the glass cloth is present as a core material, which establishes the dimensional stability and low coefficient of expansion of the composite structure.

There is no special limitation on the thermocompression device used for manufacturing the composite structure of the present invention. It is possible to use any apparatus generally used by practitioners in that field when bonding the circuit substrate for printed circuit boards and copper foil. However, it is preferred to perform thermocompression bonding under the following conditions. That is, after multiple glass cloths and the extruded fluoropolymer sheets are overlapped in register with one another, a heating roller, hot plate press in a vacuum atmosphere, or similar apparatus, is used to raise the temperature from room temperature to a temperature a higher than the melting point of the melt-processable fluoropolymer and the flow temperature of the LCP. The system is kept at that temperature for a period of time during the pressing of the glass cloth into the thickness of the fluoropolymer sheet. Although the thermocompression temperature depends on the types of the melt-processable fluoropolymer and liquid crystal polymer used, it is preferred to be 5-40° C. above the melting point of the fluoropolymer. If the temperature is above the melting temperature of the LCP or above the slightly lower flow temperature, its fibrous state if present in the sheet will tend to be lost. If the temperature is below the melting temperature of the LCP, the fibrous state if present will be maintained. It is preferred that the thermocompression is carried out during application of a vacuum to the assemblage of fluoropolymer sheet and glass cloth to remove air, which if not removed, can hinder the complete filling of the openings in the glass cloth with the fluoropolymer composition.

It is preferred to perform cooling of the composite structure in two steps, that is, a first cooling step and a second cooling step. In the first cooling step, the system is cooled from the thermocompression temperature to a temperature slightly higher than the glass transition temperature of the melt-processable fluoropolymer at a rate of about 10° C./min. In the second cooling step, the system is cooled from a temperature near the glass transition temperature of the melt-processable fluoropolymer to room temperature at a rate of about 2° C./min.

During thermocompression, the method of overlapping extruded melt-processable fluoropolymer sheet (A) and glass cloth (B) depends on the thickness of the targeted composite structure. They can be overlapped to form an A/B, A/B/A, or B/A/B lamination composite structure. It is also possible to change the order of multiple extruded fluoropolymer sheets (A) and glass cloth (B) as desired. It is also possible to form a multilayer composite structure by combining fluoropolymer containing composite structures, each of which has a lamination structure derived from A/B, A/B/A, or B/A/B assemblages. In addition, since extruded fluoropolymer sheet (A) contains adhesive agent such as liquid crystal polymer and functional group containing fluoropolymer, excellent adhesion with other metal layers or resin base materials can be realized even without using an adhesive layer. Consequently, further lamination can be performed by combining the fluoropolymer containing composite structures with metal layer or resin base materials, such as melt-processable fluoropolymer film, polyimide film with high heat resistance, liquid crystal polymer film, biaxially stretched liquid crystal polymer film, to form a multilayer fluoropolymer containing laminate.

Although the thickness of the composite structure can be varied depending on the application, it is usually in the range of 15-3000 μm, preferably in the range of 20-1000 μm, more preferably in the range of 30-500 μm. In order to obtain thicker fluoropolymer containing laminate, multiple extruded fluoropolymer sheets (A) and glass cloths (B) can be overlapped in register and thermocompressed together. Alternatively, composite structures of the present invention can be sequentially thermocompressed together.

Instead of arranging a pre-extruded melt-processable fluoropolymer sheet on at least one side of a glass cloth, it is also possible to form the melt-processable fluoropolymer layer by directly melt extruding the melt-processable fluoropolymer as a layer onto the surface of the glass cloth, followed by the thermocompression to form the composite structure.

If necessary, any additive can be incorporated in the fluoropolymer of the composite structure of the present invention, which does not detract from the desirable properties of the composite structure. Examples of the additives include antioxidants, light stabilizers, antistatic agents, fluorescent whitening agents, coloring agents, silica, alumina, titanium oxide, and other metal oxides; calcium carbonate, barium carbonate, and other metal carbonates; calcium sulfate, barium sulfate, and other metal sulfates; talc, clay, mica, glass, and other silicates; potassium titanate, calcium titanate, glass fiber, etc. Examples of organic fillers include carbon black, carbon nanotube, carbon nanofiber, graphite, carbon fibers, etc.

For the composite structure of the present invention, the peel strength with copper foil can be adjusted to 0.8 kg/cm or higher, preferably, 1.0 kg/cm or higher. The dielectric constant at a frequency of 10 GHz can be adjusted to 3.0 or lower, preferably, in the range of 2.1-2.8. The linear expansion coefficient can be adjusted to $25 \times 10^{-6}$/° C. or lower, preferably, $20 \times 10^{-6}$/° C. or lower.

For thermocompressed copper-clad composite structure, a copper foil with smooth surfaces in which both surfaces of Cu foil are not roughened (the surface roughness Ra of the Cu foil surfaces is about 0.3 μm or less) is preferred. For example, it is preferable to use a non-roughened rolled copper foil constituted by rolling and annealing electrolytic copper, etc. Also, it is not preferable to use an electrolytic copper foil in terms of manufacture since one surface is a roughened surface. However, in the electrolytic copper foil, if its surface is smoothed (for example, surface roughness Ra about 0.3 μm or less) by electrical and chemical treatment, the electrolytic copper foil can be used as the copper foil of the thermocompressed copper-clad composite. This surface treatment to smooth the surface is not considered a surface treatment such as surface roughening or chemical modification which is designed to increase adhesion. When roughened rolled copper foil or electrolytic copper foil having a rough surface is used, the thermocompressed copper-clad composite structure exhibits poorer high frequency dielectric properties than the copper-clad composite structure in which the not-roughened or smooth surface copper foil of the copper foil is smooth or has not been roughened, preferably having a surface smoothness Ra of no greater than 0.3 μm.

The composite structures of the present invention are suitable for use as high-frequency circuit substrates since they have a small linear expansion coefficient, high peel strength with copper foil, low dielectric constant at high frequency, and good adhesion to copper coil or other metal foils. Since the composite structure has good adhesion to copper foil or other metal layers, a fluoropolymer containing metal-clad laminate can be obtained even without using adhesive. The properties of the composite structure are carried over into the metal clad laminate. In addition, the composite structure of the present invention is suitable for use as sheet material, and lining material for large assemblies, since it has excellent chemical resistance, heat resistance, water repellency, weatherability, and low hygroscopicity.

APPLICATION EXAMPLES

The present invention will be explained below in more detail with reference to application examples and comparative examples. The present invention, however, is not limited to these examples.

In the present invention, the various properties were measured using the following methods.

(1) Melting Point (Melting Peak Temperature)

A differential scanning calorimeter (Pyris 1 type DSC, product of Perkin Elmer Corporation) was used. 10 mg of sample powder was weighed and added into an aluminum pan. After the pan is closed by crimping, the sample powder was set in the main body of the DSC, where it was heated from 150° C. to 360° C. at a rate of 10° C./min. The melting peak temperature (Tm) was derived from the resulting melting curve.

(2) Melt Flow Rate (MFR)

A melt indexer (made by Toyo Seiki K.K.) equipped with anti-corrosive cylinder, die and piston was used according to ASTM D1238-95. 5 g of sample powder was filled into the cylinder maintained at 372±1° C. After the sample was held in the cylinder for 5 min, it was extruded through the die orifice under a load of 5 kg (weight of piston plus added weight). The extruding rate (g/10 min) of the melted product at that time is reported as the MFR.

(3) Peel Strength

The adhesion strength (kg/cm) was measured according to JIS C6481 when copper foil was peeled off at a speed of 50 mm/min from the test piece.

(4) Linear Expansion Coefficient

The surface of a composite structure/copper-clad laminate was etched to remove the copper foil in order to obtain a test piece. A TMA/SS120C (product of Seiko Electronic Industry Co., Ltd.) was used. Under a test load of 50 mN, the test piece was heated from 25° C. to 250° C. at a rate of 5° C./min. The dimensional changes of the test piece were measured. The average of the values in X and Y directions was reported as the linear expansion coefficient.

(5) Dielectric Constant

The surface of a composite structure/copper-clad laminate was etched to remove the copper foil in order to obtain a test piece. The dielectric constant of the composite structure was measured at a frequency of 10 GHz according to JIS C6481.

Application Example 1

After melt-processable fluoropolymer PFA (product of Mitsui/DuPont Fluorochemical Co., Ltd., melting point 309° C., melt flow rate (372° C., 5 kg load) 36 g/10 min) and a liquid crystal polymer (Zenite® 6000 produced by DuPont and having a melting temperature of 340° C. and flow temperature of 335° C.) were fully dried, they were melt blended together with a tertiary copolymer (terpolymer) of tetrafluoroethylene, perfluoro(propyl vinyl ether) (PPVE), and $CF_2=CF[OCF_2CF(CF_3)]OCF_2CF_2CH_2OH$ (the functional monomer) used as the functional group containing melt-processable fluoropolymer PFA (PPVE content 3.7 wt %, said hydroxyl containing monomer content 1.1 wt %, melt flow rate 15 g/10 min) by using a twin screw extruder to generate pellets of the fluoropolymer mixture (melt temperature 365° C.) having a melt flow rate 51 g/10 min. The melt-processable fluoropolymer pellets had a composition by weight of melt-processable fluoropolymer PFA/liquid crystal polymer/functional group containing melt-processable fluoropolymer PFA=85/10/5, and the LCP was present in oriented fibrous form. The said pelletized melt-processable fluoropolymer mixture was extruded using a 30 mm single screw extruder using a T die (lip length 200 mm, lip clearance 1 mm, die temperature 360° C.), obtaining a 30-µm-thick melt-processable fluoropolymer sheet (sample T1), in which at least part of the liquid crystal polymer was oriented in fibrous form.

The melt-processable fluoropolymer sheet obtained (sample T1), a glass cloth (sample G) with a thickness of 45 µm and weight per unit area of 48 g/m², and copper foil (thickness 18 µm having a surface roughness Ra of 0.18 µm obtained by rolling and without surface treatment) were overlapped with each other to form a lamination structure of copper foil/T1/G/T1/copper foil, which was pressed in a vacuum hot plate press (manufactured by OEM) under a pressure of 50 kgf/cm² and vacuum of 18 hPa. The system was cooled after being kept at 340° C. for 30 min, obtaining a fluoropolymer containing copper-clad laminate (sample S1a) with a thickness of about 80 µm used for measuring peel strength. Excess fluoropolymer composition extruded from the edges of the glass cloth was removed by trimming. Thinner sheet of the fluoropolymer composition could have been used to avoid the trimming step.

The surface of sample S1a was etched to remove the copper foil in order to obtain a sample used for measuring the dielectric constant and the linear expansion coefficient (sample S1b).

Application Example 2

Thermocompression was performed in the same way as described in Application Example 1 except that the lamination structure was changed to copper foil/G/T1/G/copper foil. A fluoropolymer containing copper-clad laminate with a thickness of about 75 µm used for measuring peel strength (sample S2a) was obtained. Also, the surface of sample S2a was etched to remove the copper foil in order to obtain a sample used for measuring the dielectric constant and the linear expansion coefficient (sample S2b).

Application Example 3

A 30-µm-thick melt-processable fluoropolymer sheet (sample T2), in which liquid crystal polymer was oriented in fibrous form, was obtained in the same way as described in Application Example 1 except that the composition of the melt-processable fluoropolymer mixture was changed to melt-processable fluoropolymer PFA/liquid crystal polymer/functional group containing melt-processable fluoropolymer PFA=90/5/5 (by weight). Thermocompression was performed in the same way as described in Application Example 1 except that the lamination structure was changed to copper foil/T2/G/T2/copper foil. A fluoropolymer containing copper-clad laminate with a thickness of about 80 µm used for measuring peel strength (sample S3a) was obtained. The surface of sample S3a was etched to remove the copper foil in order to obtain a sample used for measuring the dielectric constant and the linear expansion coefficient (sample S3b).

Comparative Example 1

In this comparative example of the fluoropolymer sheet contained LCP but contained no functionality (no functional groups). The same PFA and LCP was used as in Application Example 1. In this comparative example, a 30-µm-thick melt-processable fluoropolymer sheet (sample T3) was obtained in the same way as described in Application Example 1 except that the composition was changed to melt-processable fluoropolymer PFA/liquid crystal polymer/functional group containing melt-processable fluoropolymer PFA=90/10/0. The melt-processable fluoropolymer sheet obtained as well as the glass cloth and copper foil used in Application Example 1 were overlapped with each other to form a lamination structure of copper foil/T3/G/T3/copper foil, followed by thermocompression performed in the same way as described in Application Example 1. A composite structure/copper-clad laminate used for measuring peel strength (sample R1a) was obtained. Also, the surface of sample R1a was etched to remove the copper foil to obtain a sample used for measuring the dielectric constant and the linear expansion coefficient (sample R1b).

Comparative Example 2

The melt-processable fluoropolymer PFA used in Application Example 1 was used to form a lamination structure of copper foil/melt-processable fluoropolymer PFA/copper foil. After it was compression molded into a sheet form using a hot plate press at 350° C. as carried out in Application Example 1, it was cooled producing a 100-µm-thick melt-processable fluoropolymer PFA sheet used as sample R2a. The surface of sample R2a was etched to remove the copper foil in order to obtain a sample used for measuring the dielectric constant and the linear expansion coefficient (sample R2b).

The properties of each of the fluoropolymer containing copper-clad laminates and the fluoropolymer containing composite structures obtained by etching the copper foil on the surface were measured using the following methods. The results are shown in Tables 1 and 2.

In the composite structures formed in each of the Examples, Application and Comparative, complete embedding of the glass cloth into the thickness(es) of the fluoropolymer sheet was obtained. The open spaces in the glass fabric were completely filled with the fluoropolymer composition, resulting in an essentially nonporous, nonhygroscopic composite structure. Presence of the fluoropolymer composition at each surface of the glass fabric was indicated by the peel strength results reported in Table 2.

While Comparative Example 1 is comparative with the Application examples with respect to adhesion to copper, this Comparative Example is an example of the present invention with respect to the thermocompression process, which does not require the presence of adhesive agent.

TABLE 1

|  | Composition of the fluoropolymer sheet | | | |
| --- | --- | --- | --- | --- |
|  | T1 | T2 | T3 | T4 |
| PFA (wt %) | 85 | 90 | 90 | 100 |
| Liquid crystal polymer (wt %) | 10 | 5 | 10 | — |
| Functional group containing PFA (wt %) | 5 | 5 | — | — |
| Thickness (µm) | 30 | 30 | 30 | 100 |
| Melt flow rate | 51 | 42 | 55 | 36 |

TABLE 2

|  |  | Application Example 1 | Application Example 2 | Application Example 3 | Comparative Example 1 | Comparative Example 2 |
| --- | --- | --- | --- | --- | --- | --- |
| Lamination structure | First layer | T1 | G | T2 | T3 | R2 |
|  | Second layer | G | T1 | G | G | — |
|  | Third layer | T1 | G | T2 | T3 | — |
| Peel strength |  | 1.4 | 0.9 | 1.1 | 0.7 | 0.5 |
| Dielectric constant |  | 2.6 | 2.7 | 2.5 | 2.5 | 2.1 |
| Linear expansion coefficient |  | 17 | 16 | 17 | 18 | 240 |

In Application Example 1, the linear expansion coefficient of the composite structure was reduced to about 1/10 of that of the fluoropolymer itself (Comparative Example 2) while the high dielectric characteristic of the fluoropolymer was maintained. The peel strength was also improved compared with that of the fluoropolymer in Comparative Example 2. The improvement in adhesion of application Example 2 over Comparative Example 2. is 80% (calculation: [(0.9-0.5)÷0.5]×100. As a result of blending the liquid crystal polymer with the melt-processable fluoropolymer, the melt flow rate of the blend became higher than that of the melt-processable fluoropolymer. When Application Example 1 was practiced with the omission of the LCP, the result was incomplete embedding of the glass cloth into the fluoropolymer sheet and cracks formed in the sheet.

In the composite structure of Application Example 2, some unevenness of the presence of the fluoropolymer composition at the surfaces was visible, resulting in the peel strength being lower than that in Application Example 1. Nevertheless, considerable improvement over Comparative Examples 1 and 2 was obtained.

In Application Example 3, the peel strength was lower than that in Application Example 1 even though they had the same lamination structure, because of the use of less LCP.

The invention claimed is:

1. A composite structure comprising dimensionally stable glass cloth and melt-processable fluoropolymer, the entire thickness of said glass cloth being embedded in said fluoropolymer, and a cooper layer adhered to at least one surface of said glass cloth embedded in said fluoropolymer, said fluoropolymer containing an effective amount of adhesive agent to improve the adhesion of said glass cloth embedded in said fluoropolymer to said copper layer by at least 60% as compared to said glass cloth embedded in said fluoropolymer wherein said fluoropolymer contains no adhesive agent.

2. The composite structure of claim 1 wherein said glass cloth is embedded into said fluoropolymer by contacting at least one surface of said glass cloth with a sheet of said fluoropolymer and melting said sheet while compressing said glass cloth against said fluoropolymer sheet, thereby forcing said the entire thickness of said glass cloth into said fluoropolymer sheet.

3. The composite structure of claim 2 wherein both surfaces of said glass cloth are contacted by a sheet of said fluoropolymer and said melting and compressing forcing said glass cloth and each said fluoropolymer sheet together to embed the entire thickness of said glass cloth with fluoropolymer from said sheets thereof.

4. The composite structure of claim 1 containing two said glass cloths superimposed adjacent to one another, the entire thickness of both said glass cloths being embedded in said fluoropolymer.

5. The composite structure of claim 4 wherein said fluoropolymer is embedded into both said glass cloths by interposing a sheet of said fluoropolymer between said glass cloths and melting said sheet while compressing said glass clothe against said sheet, thereby forcing the entire thickness of each said glass cloth into said fluoropolymer sheet.

6. The composite structure of claim 1 wherein the peel strength between said copper layer and said glass cloth embedded in said fluoropolymer is at least 0.8 kg/cm.

7. The composite structure of claim 1 having a layer of copper adhered to both surfaces of said glass cloth embedded in said fluoropolymer.

8. The composite structure of claim 1 having a dielectric constant at a frequency of 10 GHz of no greater than 3.0 and a coefficient of linear expansion of no greater than $2.5 \times 10^{-5}$/° C.

9. The composite structure of claim 1 wherein said adhesive agent comprises functional groups contained by said fluoropolymer and LCP contained within said fluoropolymer.

10. The composite structure of claim 9 wherein said LCP has orientation in the fibrous state within said fluoropolymer.

11. The composite structure of claim 9 wherein said LCP is contained within said fluoropolymer as particles.

\* \* \* \* \*